Feb. 27, 1962 R. H. FULLER 3,023,378

VOLTAGE-CONTROLLED CAPACITANCE CONVERTER-MODULATOR

Filed Nov. 27, 1959

RICHARD H. FULLER

INVENTOR.

BY Spensley and Horn

ATTORNEYS

United States Patent Office 3,023,378

Patented Feb. 27, 1962

3,023,378
VOLTAGE-CONTROLLED CAPACITANCE CONVERTER-MODULATOR

Richard Harrison Fuller, Playa Del Rey, Calif., assignor to Pacific Semiconductors, Inc., Culver City, Calif., a corporation of Delaware Filed Nov. 27, 1959, Ser. No. 855,748
10 Claims. (Cl. 332—52)

Figure 1:
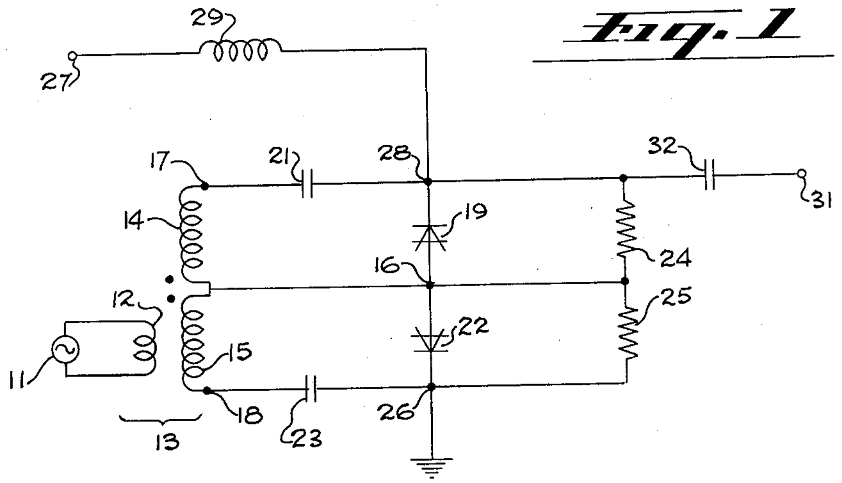

This invention relates to modulating systems and more particularly, to amplitude modulators in which the modulating voltage differentially varies the tuning of coupled resonant circuits by changing the capacitance of voltage variable capacitors, such as, for example, by causing variations in the junction capacity of voltage variable semiconductor capacitors. The present invention also relates to electronic circuits in which such modulators can be utilized, as for example, in wide-band direct current amplifiers.

In the electronics art there are various instances in which it is desired to amplify low-level D.C. signals. The most direct method of accomplishing this objective is to use a D.C. coupled amplifier. However, for slowly varying D.C. signals of low amplitude the inherent voltage drift of the D.C. amplifier is frequently larger than the magnitude of the signal being amplified. These low frequency drift signals can be blocked by utilizing A.C. coupling within the amplifier and converting the low-level D.C. signal voltage into an amplitude modulation of a fixed-frequency carrier which, after being amplified, is rectified and filtered. Three well known converter devices used in such circuits are the vibrating-reed contact modulator (mechanical chopper), the diode bridge modulator, and the transistor modulator. In none of these three converter or modulating devices is voltage gain obtainable. In operation, each of these devices acts as a switch which alternately transfers the modulating signal between two input terminals of the amplifier. The signal seen by the amplifier then appears sampled at the switching rate of the modulating signal or as an amplitude modulation of a square wave at the switching frequency. However, these three aforementioned devices are not without their own disadvantages. The vibrating-reed contact modulator is relatively bulky, vibration and shock sensitive, requires a high-energy driving source, has a fairly short life, is not too reliable and has a limited chopping rate. The diode bridge modulator has a low chopping rate due to transient effects in the diodes, also requires a high-energy driving source, and requires a close match in the diode characteristics in both forward and reverse biased conditions. The characteristics which are highly temperature variant in both directions must be matched over the full temperature range of operation. The transistor modulator has a low chopping rate due to transient effects in the transistors and it also requires a high-energy driving source. Additionally, transistors which are closely matched as to their collector saturation voltage and collector current are necessary. The preferred embodiment of the present invention overcomes the enumerated disadvantages of prior art devices while providing the additional advantage of power gain in the modulator unit itself.

The present invention is predicated upon a novel converter circuit in which resonant circuits are differentially coupled so that no carrier output is obtained in the absence of a modulating signal input. The tuning of the resonant circuits is controlled by the modulating voltage which causes variations in the capacity of voltage variable capacitors. Although there are numerous devices which possess the desired property of capacity variance as a function of changes in applied voltage, the preferred embodiment of the present invention utilizes semiconductor voltage variable capacitors. The converter circuit is particularly siutable for incorporation into a wide band D.C. amplifier by following it with a tuned R.F. amplifier and a synchronous detector. A feedback loop around the amplifier would further stabilize operation and provide a high and constant amplifier input impedance of from 10 to 50 megohms, thereby substantially freeing such an amplifier from any loading effects upon a weak voltage source to which it is connected.

It is therefore an object of the present invention to provide an amplitude modulator in which significant voltage and power gain can be realized.

Another object of the present invention is to provide a stabilized modulator in which changes in output voltage due to shifts in carrier amplitude or frequency are minimized.

A further object of the present invention is to provide a modulator in which the tuned circuits are not loaded by the output load impedance in the absence of a modulating voltage input.

Yet another object of the present invention is to provide a modulator which produces no carrier output in the absence of a modulating voltage input.

Still another object of the present invention is to provide a modulator suitable for incorporation in wide-band D.C. amplifiers and other electronic circuits.

Yet another object of the present invention is to apply semiconductor voltage variable capacitors in communication circuits and the like.

A still further object of the present invention is to provide semiconductor voltage variable capacitor modulators in which changes in output voltage due to temperature variance of junction capacitance is minimized.

Figure 2:
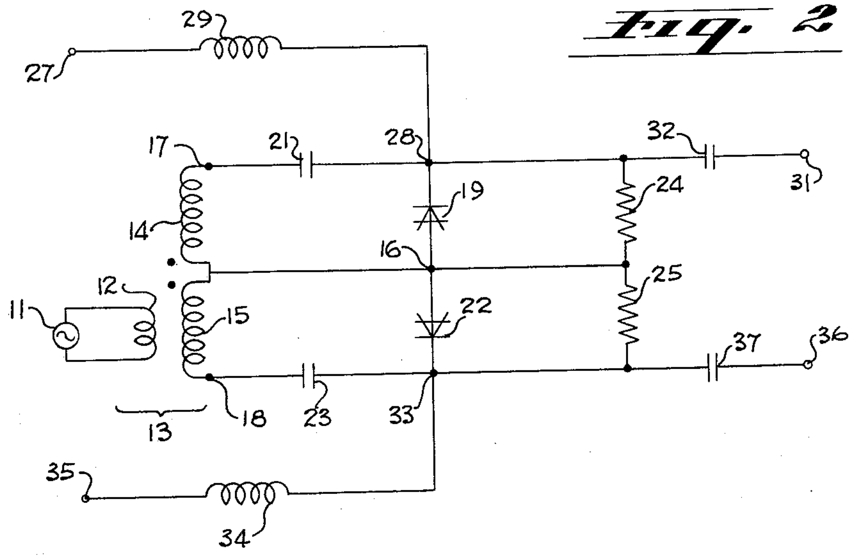

The novel features which are believed to be characteristic of the present invention, together with further objects and advantages thereof, will be better understood from the following description considered in connection with the accompanying drawings in which:

FIGURE 1 shows a voltage controlled unbalanced modulator circuit in accordance with an embodiment of the present invention using semiconductor voltage variable capacitors; and FIGURE 2 shows a voltage controlled balanced modulator circuit in accordance with an embodiment of the present invention using semiconductor voltage variable capacitors.

Referring now to FIGURE 1, a source of radio frequency carrier waves 11, of a predetermined frequency, is connected across primary winding 12 of radio frequency transformer 13. Secondary windings 14 and 15 of radio frequency transformer 13 are connected in series opposition as indicated, with the joined ends connected to point 16. The other end of secondary winding 14 is connected to point 17, and the other end of secondary winding 15 is connected to point 18. Connected between points 16 and 17, and hence across secondary winding 14, is a series combination of semiconductor voltage variable capacitor 19 and blocking capacitor 21, while connected between points 16 and 18, and hence across secondary winding 15, is an identical series combination of semiconductor voltage variable capacitor 22 and blocking capacitor 23. Semiconductor capacitors 19 and 22 are so oriented that like elements are connected to point 16, thereby aligning said semiconductor diodes in series opposition. Thus, two closed loop radio frequency circuits are formed, one loop passing from point 16 through secondary winding 14 to point 17, through blocking capacitor 21 and semiconductor capacitor 19 back to point 16, and the other similar loop passing from point 16 through secondary winding 15 to point 18, through blocking capacitor 23 and semiconductor capacitor 22 back to point 16. Note that for R.F. carrier frequencies the closed loops are differentially coupled by the series-opposition connection of R.F. transformer secondaries 14 and 15, while for modulating frequencies the loops are differentially coupled by the series-opposition connection of the semiconductor capacitors 19 and 22.

Connected across semiconductor capacitor 19 is a load resistor 24, while connected across semiconductor capacitor 22 is a similar load resistor 25. One lead of each of semiconductor capacitor 22, blocking capacitor 23 and load resistor 25 are connected to a common ground point 26. A source of modulating voltage (not shown) is connected between ground point 26 and an input terminal 27. One lead of each of semiconductor capacitor 19, blocking capacitor 21 and load resistor 24 meet at a junction point 28 which is coupled to the input terminal 27 through an R.F. choke 29. Junction point 28 is also coupled to an output terminal 31 through a blocking capacitor 32.

The parameters of the aforementioned two closed loop R.F. circuits (comprising the series combination of transformer secondary 14, blocking capacitor 21 and voltage variable capacitor 19, and transformer secondary 15, blocking capacitor 23 and voltage variable capacitor 22 respectively) are selected so that the blocking capacitors 21 and 23 have negligible reactances at a predetermined R.F. carrier frequency, $f_c$, and so that the inductive reactances of transformer secondaries 14 and 15 are equal to the capacitive reactances arising from the junction capacities of semiconductor voltage variable capacitors 19 and 22 respectively at a predetermined frequency $f_o$, different from the R.F. carrier frequency $f_c$, thereby tuning these loops to resonance at frequency $f_o$ in the absence of a modulating signal at input terminal 27. In operation, with an R.F. carrier signal applied from R.F. source 11 and in the absence of a modulating signal at input terminal 27, the R.F. carrier source 11 excites the primary 12 of R.F. transformer 13, thereby inducing equal and opposite voltages in secondaries 14 and 15 and exciting the aforementioned R.F. loops or tank circuits at the carrier frequency $f_c$. The circulating current in the tank circuits will be relatively small since these circuits are tuned to resonance at a frequency ($f_o$) different from the carrier frequency $f_c$. Since the resonant frequencies of the two tank circuits are equal under these conditions the voltage drops across the semiconductor capacitors 19 and 22, and hence across load resistors 24 and 25 respectively, are equal and opposite and hence no net output voltage is realized at output terminal 31. (The reactance of blocking capacitor 32 is chosen to be negligible at the carrier frequency $f_c$.)

Upon application of a modulating signal voltage between input terminal 27 and ground 26 the modulating voltage will divide equally across load resistors 24 and 25 and will therefore be applied in equal magnitude but opposite biasing senses to each of semiconductor capacitors 19 and 21, thereby varying their junction capacities in opposite directions. (Blocking capacitors 21 and 23 have high reactances at modulating frequencies to prevent transformer secondaries 14 and 15 from effectively short circuiting the modulating voltage.) A positive modulating signal voltage will cause a decrease in the junction capacity of semiconductor capacitor 19 and an increase in the junction capacity of semiconductor capacitor 22 thereby causing a shift in the resonant frequency of the tank circuit containing semiconductor capacitor 19 toward the carrier frequency and a corresponding shift in the resonant frequency of the tank circuit containing semiconductor capacitor 22 away from the carrier frequency. The magnitude of the voltage across semiconductor capacitor 19 will increase and that across semiconductor capacitor 22 will decrease, thereby causing a net R.F. output voltage to be realized at the carrier frequency at output terminal 31. The reactance of blocking capacitor 32 is very high at modulating frequencies, hence variations in the applied modulating voltage will be reflected as corresponding variations in the magnitude of the R.F. carrier voltage appearing at output terminal 31, i.e., a modulated carrier output voltage is obtained at output terminal 31. The R.F. carrier voltage is blocked from the modulating voltage source connected to input terminal 27 by R.F. choke 29 which has a high reactance at the R.F. carrier frequency and negligible reactance at modulating frequencies.

A reversal in the polarity of the modulating signal will cause a phase reversal of the output voltage appearing at terminal 31. If the initial resonant frequency $f_o$ is above the R.F. carrier frequency $f_c$, the output voltage, when rectified, will be inverted with respect to the applied modulating signal, while if $f_o$ is below $f_c$ then no inversion will occur.

Referring now to FIGURE 2, there is shown the balanced version of the basic differential converter circuit of FIGURE 1. The R.F. circuitry is identical to that shown in FIGURE 1 and its theory of operation is the same. In the modulating circuitry, however, instead of grounding one lead of each of semiconductor capacitor 22, blocking capacitor 23 and load resistor 25, these leads are now joined at a junction point 33. Balanced modulating signal input terminals 27 and 35 are connected to junction points 28 and 33 respectively through R.F. chokes 29 and 34 respectively, while balanced output terminals 31 and 36 are connected to junction points 28 and 33 respectively through blocking capacitors 32 and 37 respectively. R.F. choke 34 and blocking capacitor 37 perform identical functions as R.F. choke 29 and blocking capacitor 32 respectively. Thus, FIGURE 2 differs from FIGURE 1 only in the isolation of a point that was grounded in FIGURE 1, thereby converting an unbalanced circuit to one that is balanced. The overall operation of the two circuits is identical.

In general, the carrier frequency, $f_c$, may be from 10 megacycles to 100 megacycles, and the Q of the tuned R.F. circuits should be between 50 and 100. The junction potential of the semiconductor capacitors will provide sufficient bias to allow a combined carrier and modulating signal amplitude of about 200 millivolts without the necessity of providing additional bias, and a voltage gain of from 10 to 20 db should be obtainable under these conditions. Although the carrier voltage must be a sine wave, the modulating signal can be of any wave-shape. However, if a modulating signal of symmetrical waveform is utilized its frequency should be less than about one one-hundredth of the carrier frequency, $f_c$, to facilitate proper operation of blocking capacitors 21, 23, 32 and 33, and R.F. chokes 29 and 34 by providing for each of these elements reactance ratios of at least 100:1 for these two frequencies.

A practical example of the preferred embodiments of FIGURES 1 and 2 could utilize a carrier frequency, $f_c$, of 10 mc., a resonant circuit Q of 100, and silicon semiconductor voltage variable capacitors 19 and 22 such as described and claimed in co-pending U.S. patent application Serial No. 737,354, entitled Voltage Sensitive Semiconductor Capacitor, filed May 23, 1958, by Sanford H. Barnes and John E. Mann. For any modulating signal varying from D.C. up to 50 kc. the tank circuits should be tuned to resonance in the absence of a modulating signal at either $f_o$=9.9 mc. or $f_o$=10.1 mc. to insure operation over fairly linear portions of the resonant circuit response curves. A typical modulating signal voltage might vary between 1 millivolt and 0.1 volt, resulting in an amplification factor for the converter of about 10 db. High signal levels could be handled with the application of additional bias voltage to supplement the inherent junction potential of the diodes.

Semiconductor devices are preferred as the voltage variable capacitors 19 and 22 because of the unique combination of properties they possess. The junction capacity of fused junction type semiconductor diodes is essentially independent of the frequency of the applied A.C. signal, and is determined solely by the applied bias voltage. The junction capacity also remains substantially constant over a wide range of ambient temperature variations. The semiconductor devices also have the additional advantage of built-in bias voltage provided by its junction potential, such junction potential bias being adequate for proper operation of the converter circuit of the present invention with the small signal amplitudes normally encountered in such applications. In the converter circuit of the present invention the operating bias level established by the junction potential of the semiconductor devices biases them in the reverse direction and the small modulating signals are not sufficient to overcome this bias, hence they do not conduct and no signal rectification occurs. The semiconductor devices are used primarily as voltage variable capacitors, the junction capacitance thereof changing in accordance with bias changes caused by the modulating signal adding and subtracting from the fixed junction potential bias level.

There has thus been described a new and improved voltage-controlled capacitance converter-modulator.

What is claimed as new is:

1. An amplitude modulator for receiving electrical energy from a source of radio frequency carrier waves of a preselected frequency and from a source of modulating voltage, including: first and second L-C resonant circuits tuned by voltage variable capacitances, said first and second resonant circuits being coupled in series, said resonant circuits being responsive to said radio frequency carrier waves and to electrical signals from said source of modulating voltage, said voltage variable capacitances being arranged to simultaneously change in opposite directions the resonant frequencies of said resonant circuits in response to variations in amplitude of electrical signals from said source of modulating voltage, the inductances of said first and second resonant circuits being arranged in series opposing relationship, and output terminals coupled across the series combination of said first and second resonant circuits, the resonant frequencies of said first and second resonant circuits in the absence of a modulating voltage being substantially identical and different from said preselected carrier frequency, whereby a net output voltage from said first and second resonant circuits will be obtained across said output terminals only upon application of a modulating voltage.

2. An amplitude modulator comprising a source of radio frequency carrier waves of a preselected frequency, a source of modulating voltage, converter means coupled to said source of carrier waves and to said source of modulating voltage, said converter means including a first resonant circuit having a first inductance tuned by a first voltage variable capacitor and a second resonant circuit having a second inductance tuned by a second voltage variable capacitor, said first and second resonant circuits being differentially coupled with said first and second inductances in series opposing relationship with said first and second voltage variable capacitors in series opposing relationship, the resonant frequencies of said first and second resonant circuits in the absence of a modulating voltage input being substantially identical and different from said preselected carrier frequency, and output terminals coupled across the series combination of said first and second resonant circuits.

3. An amplitude modulator comprising a source of radio frequency carrier waves of a preselected frequency, first and second L-C resonant circuits tuned by voltage variable capacitors and coupled to said source of radio frequency carrier waves, said first and second resonant circuits being differentially coupled in series with their inductances in series opposing relationship and with their voltage variable capacitors in series opposing relationship, a source of modulating voltage coupled across the series combination of said first and second resonant circuits, and output terminals coupled across the series combination of said first and second resonant circuits, the resonant frequencies of said first and second resonant circuits in the absence of a modulating voltage being substantially identical and different from said preselected carrier frequency whereby a net output voltage from said first and second resonant circuits will be obtained across said output terminals only upon application of a modulating voltage.

4. An amplitude modulator comprising a source of radio frequency carrier waves of a preselected frequency, first and second L-C resonant circuits tuned by the junction capacity of semiconductor voltage variable capacitors and coupled to said source of radio frequency carrier waves, said first and second resonant circuits being differentially coupled in series with their inductances in series opposing relationship and with their voltage variable capacitors in series opposing relationship, a source of modulating voltage coupled across the series combination of said first and second resonant circuits, and output terminals coupled across the series combination of said first and second resonant circuits, the resonant frequencies of said first and second resonant circuits in the absence of a modulating voltage being substantially identical and different from said preselected carrier frequency whereby a net output voltage from said first and second resonant circuits will be obtained across said output terminals only upon application of a modulating voltage.

5. An amplitude modulator comprising a source of radio frequency carrier waves of a preselected frequency, differentially coupled first and second L-C resonant circuits tuned by the junction capacity of semiconductor voltage variable capacitors and coupled to said source of radio frequency carrier waves, said first and second resonant circuits being differentially coupled in series with their inductances in series opposing relationship and with their voltage variable capacitors in series opposing relationship, a source of modulating voltage coupled across the series combination of said first and second resonant circuits, the maximum frequency of variations in said carrier voltage being less than a predetermined maximum band width, the resonant frequency of said first and second resonant circuits in the absence of a modulating voltage input being substantially identical and differing from said preselected carrier frequency by at least said predetermined maximum band width.

6. An amplitude modulator comprising a source of carrier waves of a preselected frequency, a transformer having its primary coupled to said source of carrier waves and having first and second secondary windings connected in series opposition, first and second silicon semiconductor voltage variable capacitors connected in series opposition, said first capacitor being coupled to the first secondary winding of said transformer to form a first resonant circuit tuned by the junction capacitance of said first capacitor and said second capacitor being coupled to the second secondary winding of said transformer to form a second resonant circuit tuned by the junction capacitance of said second capacitor, first and second load resistors in series, said first load resistor being connected across said first semiconductor capacitor and said second load resistor being connected across said second semiconductor capacitor, a source of modulating voltage coupled across the series combination of said first and second load resistors, and output terminals coupled across the series combination of said first and second load resistors, said first and second resonant circuits being tuned to resonance at the same frequency different from said preselected carrier frequency in the absence of a modulating voltage.

7. In an amplitude modulator for employing a modulating voltage to differentially vary the tuning of coupled resonant circuits: converter means adapted to receive electrical energy from a source of carrier waves of a preselected frequency and from a source of modulating voltage, said converter means including a first resonant circuit having a first inductance tuned by a first voltage variable capacitor and a second resonant circuit having a circuit having a first inductance tuned by the junction capacitor, said first and second resonant circuits being differentially coupled with said first and second inductances in series opposing relationship and with said first and second voltage variable capacitors in series opposing relationship, the resonant frequencies of said first and second resonant circuits in the absence of a modulating voltage input being substantially identical and different from said preselected carrier frequency, and output terminals coupled across the series combination of said first and second resonant circuits.

8. In an amplitude modulator for employing a modulating voltage to differentially vary the tuning of coupled resonant circuits: converter means adapted to receive electrical energy from a source of carrier waves of a preselected frequency and from a source of modulating voltage, said converter means including a first resonant circuit having a first inductance tuned by the junction capacitance of a first silicon semiconductor voltage variable capacitor and a second resonant circuit having a second inductance tuned by the junction capacitance of a second silicon semiconductor voltage variable capacitor, said first and second resonant circuits being differentially coupled with said first and second inductances in series opposing relationship and with said first and second voltage variable capacitors in series opposing relationship, the resonant frequencies of said first and second resonant circuits in the absence of a modulating voltage input being substantially identical and different from said preselected carrier frequency, and output terminals coupled across the series combination of said first and second resonant circuits.

9. In an amplitude modulator for employing a modulating voltage to differentially vary the tuning of coupled resonant circuits: converter means adapted to receive electrical energy from a source of carrier waves of a preselected frequency within the frequency range of from about 10 to about 100 megacycles and from a source of modulating voltage of a symmetrical wave form, variations in the amplitude of said modulating signal being not greater in frequency than about $\frac{1}{100}$ of said carrier frequency, said converter means including a first resonant circuit having a first inductance tuned by a first voltage variable capacitor and a second resonant circuit having a second inductance tuned by a second voltage variable capacitor, said first and second resonant circuits being differentially coupled with said first and second inductances in series opposing relationship and with said first and second voltage variable capacitors in series opposing relationship, the resonant frequencies of said first and second resonant circuits in the absence of a modulating voltage input being substantially identical and different from said preselected carrier frequency, and output terminals coupled across the series combination of said first and second resonant circuits.

10. In an amplitude modulator for embodying a modulating voltage to differentially vary the tuning of coupled resonant circuits: converter means adapted to receive electrical energy from a source of carrier waves of a preselected frequency and from a source of modulating voltage, said converter means including a first resonant circuit having a first inductance tuned by a first voltage variable capacitor and a second resonant circuit having a second inductance tuned by a second voltage variable capacitor, said first and second resonant circuits being differentially coupled with said first and second inductances in series opposing relationship and with said first and second voltage variable capacitors in series opposing relationship, the resonant frequencies of said first and second resonant circuits in the absence of a modulating voltage input being substantially identical and sufficiently different from said preselected carrier frequency to place said preselected carrier frequency at a predetermined point on the linear portion of the response curves of said resonant circuits, and output terminals coupled across the series combination of said first and second resonant circuits.

References Cited in the file of this patent

UNITED STATES PATENTS

| | | |
|---|---|---|
| 2,151,315 | Guanella | Feb. 20, 1940 |
| 2,817,818 | Patton | Dec. 24, 1957 |
| 2,820,109 | Dewitz | Jan. 14, 1958 |